INVENTORS
Francis D. Kaiser and
Paul Evans, Jr.
BY
Donald R. Lackey
ATTORNEY

United States Patent Office 3,398,349
Patented Aug. 20, 1968

3,398,349
ENCASED HIGH VOLTAGE ELECTRICAL CONVERTER OF THE SEMICONDUCTOR TYPE

Paul Evans, Jr., Warren, Ohio, and Francis D. Kaiser, Sharon, Pa., assignors to Westinghouse Electric Corporation, Pittsburgh, Pa., a corporation of Pennsylvania
Filed Oct. 20, 1965, Ser. No. 498,924
6 Claims. (Cl. 321—5)

ABSTRACT OF THE DISCLOSURE

An electrical converter having a plurality of groups of serially connected semiconductor devices disposed on spaced parallel planes, with the groups of semiconductor devices being serially connected to reverse the direction of current flow from group to group. The plurality of groups of semiconductor devices are disposed in a tank filled with insulating and cooling means. Firing means for the semiconductor devices is provided by a high voltage cable, means for providing switching pulses for the high voltage cable, and a plurality of magnetic cores each having a plurality of windings. The magnetic cores are disposed in predetermined spaced relation on the high voltage cable, each adjacent one of the groups, with the windings on the magnetic cores being connected to the semiconductor devices of its associated group.

High voltage electrical converters, such as the type associated with D.C. transmission, require large pluralities of semiconductor devices to be serially connected. Many difficulties are experienced, however, when connecting large pluralities of semiconductor devices, such as silicon controlled rectifiers, in series circuit relation, which must be overcome in order to provide reliable apparatus having a cost within practical limits. For example, it is important to distribute steady state and transient voltages across the serially connected string of devices in a substantially uniform manner, in order to insure that the maximum peak reverse blocking voltage (PRV) rating of the devices is not exceeded, and in order to keep from seriously derating the devices, which would adversely affect the cost of the apparatus. It is also important to control the rate of change of current in the devices. If the current increases at an excessive rate, the device may be destroyed, particularly when the devices are switched to their conductive state. Copending application, Ser. No. 485,743, filed Sept. 8, 1965, by L. A. Kilgore et al., and assigned to the same assignee as the present application, which will hereinafter be referred to as the first mentioned copending application, teaches protective and voltage distributing arrangements for serially connected semiconductor devices, which may be utilized to uniformly distribute steady state and transient or impulse voltages across a plurality of serially connected devices, and which controls the rate of change of current through the devices.

Additional difficulties arise in the mechanics of pulsing the gate or control electrode of serially connected controllable semiconductor devices. The gates must all be fired within a few microseconds of each other, the firing pulse must be controlled from ground potential, and the firing arrangement must not upset the substantially uniform steady state and transient voltage distributions across the devices.

In order to offset the stray capacitance of each device to ground, and provide a substantially uniform transient voltage distribution across the serially connected devices, a capacitor may be connected in shunt with each of the devices, to reduce the high frequency impedance of the devices along the series circuit. Additional stray capacitance to ground is introduced into the circuit, however, by the capacitance of the windings and leads of the pulse transformer. Therefore, the number of semiconductor devices that may be connected to one pulse transformer must be limited, if serious derating of the devices is to be prevented. If the serially connected string of devices is separated into a plurality of serially connected groups, with a pulse transformer serving each group, the problem of simultaneously pulsing each group arises. The groups must not only be simultaneously pulsed, but the voltage distribution between groups must not be affected by the pulsing means. Further, conventional means for simultaneously pulsing each group may be impractical from a cost standpoint, due to the fact that the means would have to be electrically insulated for the voltage across all of the groups. The copending application hereinbefore referred to solves these problems by utilizing pulsing means at each group which is responsive to electromagnetic energy, with the electromagnetic energy being beamed or focused on each group from a master firing control. Thus, none of the components are subjected to the total voltage across all of the groups, and each group has its own pulse producing means which is arranged to insure that the pulse producing means will not affect the substantially uniform voltage distribution between the groups.

It would also be desirable to be able to pulse each group simultaneously from a single pulse producing means, which pulse is distributed to the pulse transformer secondary windings of each group of electrically connected primary windings. Copending application Serial No. 485,753, filed September 8, 1965, by L. A. Kilgore et al., which will hereinafter be referred to as the latter mentioned copending application, provides these functions by utilizing a high voltage cable as a common primary winding for a plurality of spaced magnetic cores and associated secondary windings, which serve controllable semiconductor devices arranged in tiers or spaced groups about the high voltage cable.

The arrangement of the controllable semiconductor devices and pulsing means of the latter mentioned Kilgore et al. application is very successful on air insulated high voltage converter apparatus, where large clearances must necessarily be maintained between the various components and the apparatus is installed within a room or building whose air temperature, humidity, and air circulation rates are carefully controlled to provide adequate cooling of the semiconductor devices. Air conditioned rooms, in addition to being costly, take up considerable space. Since the total amount of apparatus involved in a D.C. power transmission installation requires a large area, it is important to reduce the overall size of each component, and even more important to encase each component within a weatherproof housing to allow all apparatus to be disposed outdoors, and eliminate the necessity of providing special air conditioned buildings for any of the components.

It is possible to reduce the size of the converter package by disposing the apparatus within a dielectric cooling fluid. For example, the structure containing the controllable semiconductor devices may be disposed within a metallic weatherproof casing or tank, and the tank filled with a liquid dielectric, such as oil, or a gaseous dielectric such as sulfur hexafluoride ($SF_6$). The converter package size, compared with air insulated apparatus of similar rating, may be reduced as much as fifty to one, and the converter may be mounted outdoors. This appears to solve the objectives of eliminating special air conditioned buildings and mounting the apparatus in weatherproof enclosures. However, when the clearances between the components of air insulated converter structures, such as the structure taught in the latter mentioned Kilgore et al. application, are reduced those clearances allowed by the insulating dielectric fluid, and the apparatus is disposed within a metallic casing or tank, it is found that the uniform transient voltage distribution which was present with the former clearances and mounting arrangement has become non-uniform. Thus, it would be desirable to provide a new and improved solid state converter arrangement which will provide a substantially uniform transient voltage distribution across the series connected solid state or semiconductor devices, while disposed in a cooling and insulating fluid and encased in a metallic enclosure or tank. It would also be desirable to maintain the construction taught by the latter mentioned Kilgore et al. application wherein the series connected semiconductor devices are divided into a plurality of groups, with each group being disposed on a plane and the planes of all the groups disposed in spaced parallel relation perpendicular to a common axis or center line.

Accordingly, it is an object of the invention to provide a new and improved high voltage electrical converter arrangement which utilizes serially connected semiconductor devices disposed within a metallic enclosure.

Another object of the invention is to provide a new and improved high voltage electrical converter which utilizes one or more strings of serially connected a semiconductor devices disposed within a tank containing an electrically insulating fluid dielectric, and which provides a substantially uniform distribution of transient and steady state voltages across the serially connected devices.

A further object of the invention is to provide a new and improved high voltage electrical converter having a plurality of serially connected controllable semiconductor devices arranged into a plurality of parallel spaced planes about a common axis which is perpendicular to the planes, and disposed within a metallic casing containing an insulating fluid dielectric.

Briefly, the present invention accomplishes the above cited objects by constructing the electrical converter in multiple axial layers or tiers, each containing a group of serially connected semiconductor devices in which the devices of each tier are disposed on a plane which is parallel with the planes of the other tiers, and the tiers are disposed on a common axis perpendicular to the planes of the tiers. The devices in each tier are serially connected and the tiers are serially connected such that the current direction in adjacent tiers is reversed. This results in very low distributed series inductance, which dampens oscillations produced by impulse voltages, and increases the resonant frequency of the structure to a magnitude which is inherently dampened by the structure. In addition to damping voltage oscillations by reducing the distributed series inductance of the structure, it is essential that the initial or capacitive voltage distribution of an impulse or transient voltage across the serially connected semiconductor devices be uniform, to prevent voltage concentrations which would damage the semiconductor devices. Impulse or capacitive voltage distribution is determined by the distribution constant alpha ($\alpha$) which is determined by the square root of the raito of the distributed capacitance of the semiconductor devices to ground ($C_g$) to the distributed series capacitance of the devices $C_s$ ($\alpha = C_g/C_s$). The smaller the distribution constant alpha, the more uniform the capacitive voltage distribution across the serially connected devices. Thus, the distributed capacitance of the devices to ground should be made as small as possible, and the distributed series capacitance of the devices should be made as large as possible. This accomplished according to the teachings of the invention, by shielding the semiconductor devices from ground, and by arranging the shielding means to increase the capacitance between adjacent tiers. The shielding means is also constructed to prevent stress concentrations which could cause corona discharges between the tiers or layers, and to the different portions of the structure which are at different potentials.

Further objects and advantages of the invention will become apparent as the following description proceeds and features of novelty which characterize the invention will be pointed out in particularity in the claims annexed to and forming a part of this specification.

For a better understanding of the invention, reference may be had to the following detailed description, taken in connection with the accompanying drawings, in which.

Figures 1, 3:
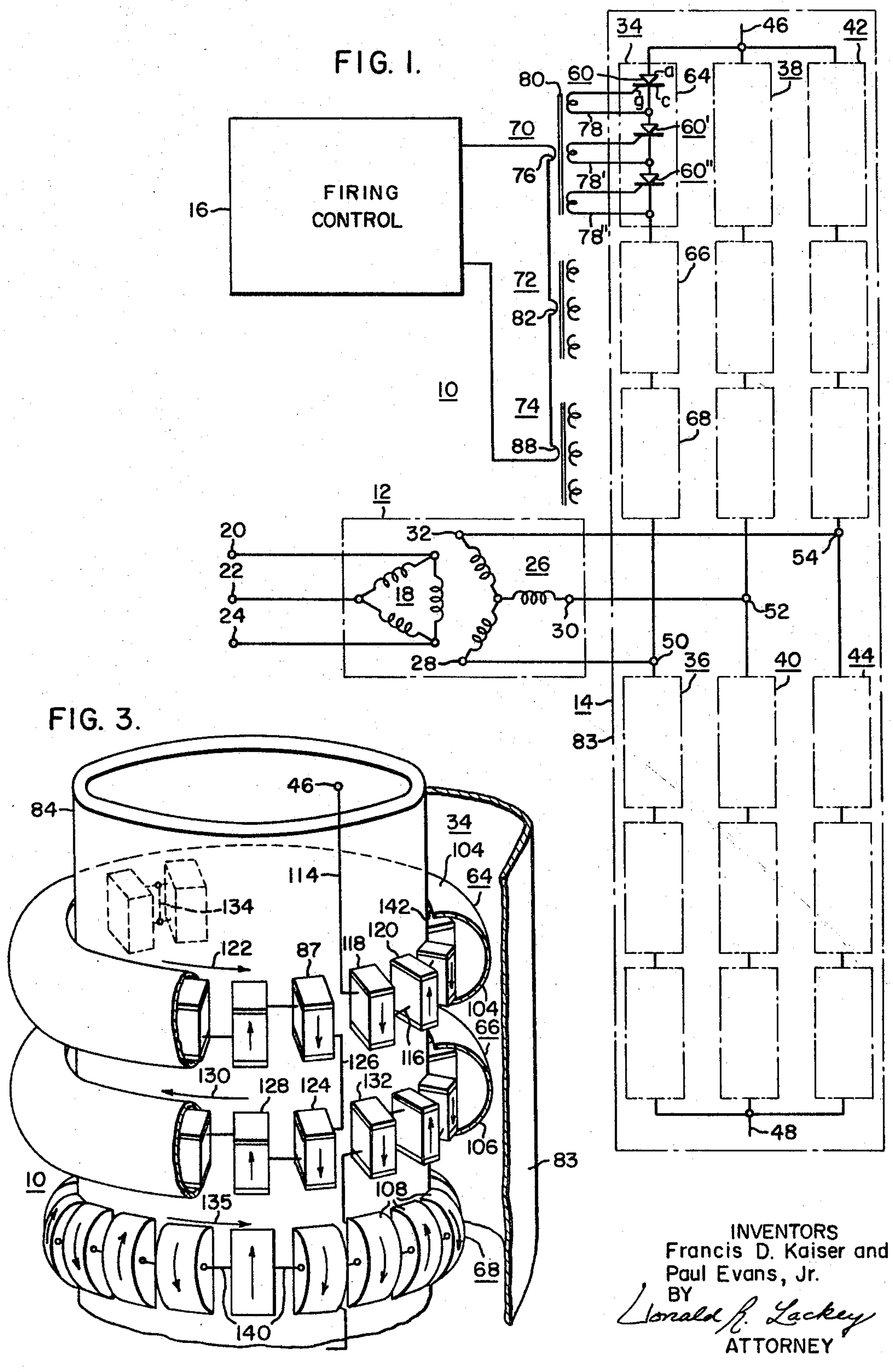
FIGURE 1 is a schematic diagram illustrating an electrical converter arrangement which may be constructed according to the teachings of the invention.
FIG. 3 is a perspective view illustrating a portion of the electrical converter shown in FIG. 2.

Referring now to the drawings, and FIG. 1 in particular, there is shown an electrical converter 10 for changing one form of electrical energy into another form. Converter 10 includes transformer 12, three-phase bridge rectifier 14, and firing control 16. Transformer 12 includes a first winding 18 having alternating current terminals 20, 22 and 24, and a second winding 26, having alternating current terminals 28, 30 and 32. Bridge rectifier 14 includes a plurality of legs 34, 36, 38, 40, 42 and 44. Legs 34, 38 and 42 each have one end connected to direct current terminals 46, and their other ends connected to alternating current terminals 50, 52 and 54, respectively. Legs 36, 40 and 44 each have one end connected to direct current terminal 48, and their other ends connected to alternating current terminals 50, 52 and 54, respectively.

Winding 26 of transformer 12 has its alternating current terminals 28, 30 and 32 connected to alternating current terminals 28, 30 and 32 connected to alternating current terminals 50, 52 and 54, respectively, of bridge rectifier 14. Converter 10 may be a rectifier, in which case an alternating current potential (not shown) would be connected to alternating current terminals 20, 22 and 24 and a direct current load (not shown) would be connected to direct current terminals 46, and 48; or, it may be an inverter, with a direct current potential (not shown) being connected to direct current terminals 46 and 48, and an alternating current load (not shown) being connected to alternating current terminals 20, 22 and 24.

Each of the legs 34, 36, 38, 40, 42 and 44 of bridge rectifier 14, includes a plurality of serially connected, controllable semiconductor devices, such as the silicon controlled rectifiers 60, 60' and 60'' shown in leg 34, with each having an anode, cathode and gate electrodes *a*, *c*, and *g*, respectively. In high voltage applications, such as D.C transmission, each leg may have hundreds of serially connected controllable semiconductor devices, in order to obtain a voltage across each device which does not exceed its peak reverse blocking voltage (PRV).

For proper operation of bridge rectifier 14, the legs of the bridge are switched from blocking to conducting states according to a predetermined sequence, controlled by firing control 16. Since firing control arrangements are well known in the art, it is not necessary to describe them in detail.

Difficulties are experienced when a large plurality of controllable semiconductor devices are connected in series circuit relation. If serious derating of the devices is to be prevented, the transient and steady state voltage distribution across the devices must be substantially uniform, the rate of change of current in the devices must be controlled when the devices are switched to their conductive state, and the devices in each leg must all be switched within a few microseconds of each other. The first mentioned copending application discloses arrangements which uniformly distribute transient and steady state voltages across the devices, controls the rate of change of current in the devices, and also discloses arrangements for firing the serially connected devices simultaneously. Because of the stray capacitance to ground associated with pulse transformers, only a limited number of devices may be connected or controlled by one pulse transformer if serious derating of the devices is to be prevented, and the first mentioned copending application discloses dividing the serially connected devices into serially connected groups, with each group containing a plurality of serially connected controllable semiconductor devices which are controlled by a single pulse transformer. In order to avoid the problems of insulation and corona associated with a pulse transformer arrangement which electrically connects all of the serially connected groups, the plurality of groups in said first mentioned copending application are controlled by pulses of electromagnetic radiation, produced by a master firing control. Thus, each group requires its own pulsing arrangement, which is electrically isolated from the other groups. The latter mentioned copending application discloses a new arrangement for mounting the groups of serially connected devices which further aids in uniformly distributing voltages across the devices, and discloses a pulsing arrangement for a plurality of serially connected groups, in which the groups are electrically connected, with only one pulsing source being required for all of the serially connected groups in the leg.

More specifically, the controllable semiconductor devices in each leg have a plurality of serially connected groups of devices, with the number of devices in each group being determined by the stray capacitance of the pulse transformer serving the group, and the capacitance of the external shunt capacitor connected across each device. Thus, it is convenient to divide the legs into a plurality of serially connected groups, such as represented by groups 64, 66 and 68 shown in leg 34, with each group having a predetermined plurality of serially connected devices. A pulse transformer is provided for each group, with each transformer having a separate secondary winding for each device in its associated group of semiconductor devices. For example, group 64 would have a pulse transformer 70, group 66 would have a pulse transformer 72, and group 68 would have a pulse transformer 74. Pulse transformer 70 has a primary winding 76 and a plurality of secondary windings 78, 78′, and 78″ disposed in inductive relation with a magnetic core 80, and pulse transformers 72 and 74 would have similar windings. For example, secondary winding 78 of pulse transformer 70 is illustrated connected to the gate and cathode electrodes *g* and *c*, respectively, of controlled semiconductor device 60, and it should be assumed that each pulse transformer has the same number of secondary windings as there are controllable semiconductor devices in the group it is to serve, and that the secondary windings are connected in circuit relation with the devices, such as shown in FIG. 1.

It will be noted that the primary windings 76, 82 and 88 are serially connected. A pulse transformer arrangement which allows the primary windings to be serially connected, and thus subjected to the voltage across all of the groups, is described in detail in the latter mentioned copending application. By connecting the primary windings 76, 82 and 88 serially, only one pulse means is required for each leg.

The converter construction shown in the latter mentioned copending application, however, is suitable primarily for air insulation, wherein large clearances are provided between components at different potentials, and the converter is disposed within an air conditioned building designed to provide the air flow over the semiconductor devices and their associated heat sinks necessary for their proper cooling. If the components of the latter mentioned copending applications are installed in a metallic enclosure containing a fluid insulating dielectric, and the clearances between the various components are reduced to those allowed by the insulating characteristics of the particular fluid dielectric, the prior ability of the assembly to uniformly distribute surge potentials is lost.

Figure 2:
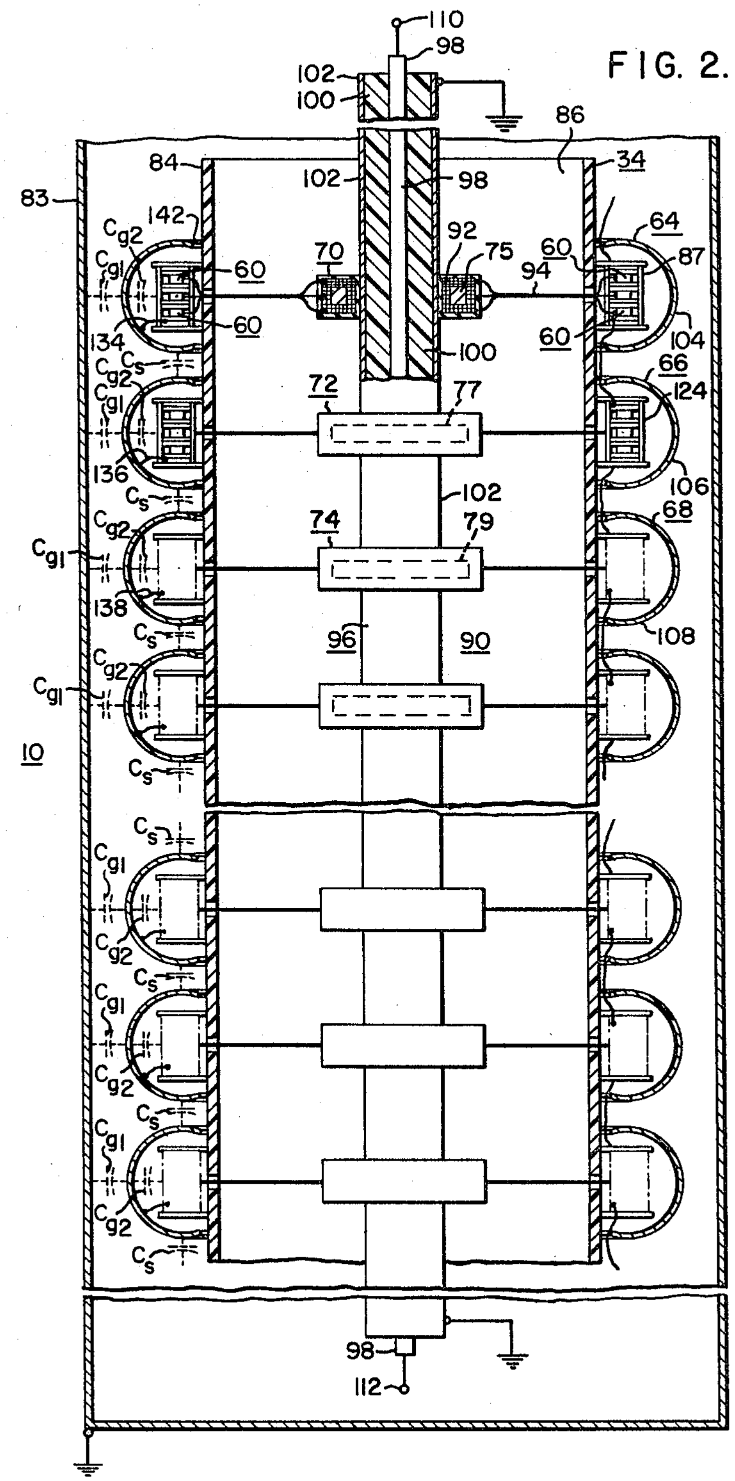
FIG. 2 is an elevational view, in section, of an electrical converter constructed according to an embodiment of the invention.

FIG. 2 is an elevational view, in section, of a leg, or portion of a leg of an electrical converter, constructed according to the teachings of the invention, which will uniformly distribute transient voltages across serially connected semiconductor devices. To obtain a substantially uniform distribution of surge potentials across the serially connected semiconductor devices, the distributed series inductance of the assembly is reduced, the distributed series capacitance of the assembly is increased, and the distributed capacitance of the semiconductor devices to ground is reduced. The reduction in distributed series inductance prevents surge potentials from creating oscillatory voltage of large magnitude, and this is accomplished by connecting the devices to provide a non-inductive current path. The increase in distributed series capacitance and decrease in the distributed capacitance of the devices to ground is required in order to reduce the distribution constant alpha to a minimum. The distribution constant alpha, as hereinbefore stated, is equal to the square root of the ratio of the capacitance of the devices to ground, to the distributed series capacitance of the devices, and the lower the distribution constant the more uniform the voltage distribution.

More specifically, FIG. 2 illustrates a leg, or portion of a leg, such as leg 34 of electrical converter 10 shown in FIG. 1, disposed within a metallic enclosure, casing or tank 83. Only leg 34 of converter 10 is shown in FIG. 2 for purposes of simplicity, but it is to be understood that the complete electrical converter 10 of FIG. 1 may be disposed within tank 80. In general, leg 34 includes means for mounting the semiconductor devices, such as tubular member 84, which has predetermined inner and outer diameters to form the desired wall thickness and circumference, as well as a central opening 86 having the desired diameter. The mounting member or means 84 is formed of an electrical insulating material, such as pressboard or one of the laminated plastic materials. While the mounting means 84 is illustrated as having a circular cross section, it will be understood that it may be rectangular, or any other suitable shape.

Semiconductor devices, such as silicon controlled rectifier 60 are disposed or mounted about the outer periphery of mounting member 84, with the devices being arranged into a plurality of groups, and each group disposed in a separate layer or tier, such as tiers 64, 66 and 68. Each layer or tier of devices includes a predetermined number of serially connected devices in the group, and the layers of devices are serially connected. For ease in mounting the devices, they may be arranged into a plurality of stacks, such as stack 87, having a plurality of serially connected devices 60, and the stacks 87 may be suitably fastened to the mounting means 84. The stacks 87 of devices 60 in each tier may then be serially connected to complete the tier. Although arranging the devices into a stack having a convenient number of devices 60, such as three or four, facilitates assembly of the converter, as the stacks may be preassembled and have means for mounting them upon mounting means 84, it is to be understood that any other suitable arrangement for forming the tiers of devices 60 may be used.

Also included in electrical converter 10 is means 90 for supplying the control pulses for firing the semiconductor devices. FIG. 2 illustrates the pulse transformer arrangement shown and described in detail in the latter mentioned copending application, but any suitable firing means may be used.

The pulse transformer arrangement 90 includes a plurality of ring shaped magnetic cores, such as magnetic cores 75, 77 and 79, with each magnetic core having a plurality of secondary windings disposed in inductive relation with the cores in an insulating manner. For example, magnetic core 75 has a plurality of secondary windings, such as the windings shown generally at 92, which are connected through leads 94 to the semiconductor devices 60 in stack 87. Each of the magnetic cores 75, 77 and 79, and their associated secondary windings, serve a layer or tier of serially connected controllable semiconductor devices. The secondary windings are disposed at predetermined spaced intervals about their associated magnetic cores, and each have leads which connect them to their associated controllable semiconductor device.

Each of the magnetic cores 75, 77 and 79 are substantially ring shaped and have a circular opening therethrough, and are served by serially connected primary windings which are actually formed by a continuous high voltage cable 96 having an electrical conductor 98 surrounded by electrical insulating means 100, such as polyethylene, and has a sufficient length to withstand the voltage across its length. The cable 96 is threaded through the openings in the various magnetic cores, with the magnetic cores having their openings in substantial registry and being spaced from one another on the cable 96 in a predetermined manner. The cable 96 is selected to withstand the maximum direct current voltage to ground which will exist across all of the tiers, plus the alternating current component. For example, a 400 kv.±D.C. transmission installation which has three rectifier bridges connected in series, would have an alternating current component of 65 kv. RMS. A polyethylene cable having an outside diameter of 3 inches and a ¾ or 1 inch diameter conductor, would be adequate to withstand the radial stress of such an installation.

In addition to withstanding radial stress, it is essential that the pulse transformer arrangement 90 prevent the formation of corona. Corona formation is prevented by the combination of stress grading coating means 102, which preferably has voltage dependent resistivity characteristics, and stress grading and shielding means, such as electrically conductive shielding members 104, 106 and 108. Coating means 102 may be in the form of a paint, which includes such materials as particulated silicon carbide held in a suitable binder, and formulated to provide predetermined voltage dependent resistivity characteristics.

The electrical conductor 98 of cable 96 has terminals 110 and 112 connected to its ends, adapted for connection to the firing control means 16 of FIG. 1.

In order to uniformly distribute surge potentials across the serially connected semiconductor devices 60 of leg 34, the distributed series inductance is reduced by connecting the tiers in a manner which reverses the direction of current flow in adjacent tiers. This is more clearly shown in FIG. 3, which is a perspective view of a portion of the converter 10, shown in FIG. 2, illustrating the mounting means 84 and tiers 64, 66 and 68, in more detail. More specifically, conductor 114 connects terminal 46 to tier 64 of leg 34, entering the stack 118 of semiconductor devices 60 at one end of the stack. The other end of stack 118 is connected to the adjacent stack 120 by electrical conductor 116, and the remaining stacks are similarly connected, providing a current path which in this instance is counterclockwise, as shown by the arrow 122. The last stack 87 of tier 64 is connected to one end of stack 124 in tier 66 by conductor 126, and the other end of stack 124 is connected to stack 128, thus providing a current path in tier 66 that is clockwise, as shown by arrow 130, and opposite to the current direction in tier 64. The last stack 132 in tier 66 is connected to tier 68 such that the current flow in tier 68 is counterclockwise, as shown by the arrow 135. As hereinbefore mentioned, the arrangement of semiconductor devices in stacks is merely a convenient way to mount the devices. They may be mounted in any other arrangement as long as they are disposed in a plurality of serially connected groups, with the groups being disposed on parallel spaced planes or tiers which are perpendicular to a common centerline or axis. Further, regardless of their arrangement in each plane, the groups or tiers should be interconnected to reverse the direction of current flow from tier to tier, to reduce the series inductance of the arrangement. Reducing the series inductance is important, in order to reduce the amplitude of voltage oscillations produced by surge potentials and in order to increase the resonant frequency of the serially connected semiconductor devices to a large magnitude which is inherently dampened by the circuit arrangement itself.

In addition to preventing and damping voltage oscillations produced by surge potentials, it is also essential that the surge potentials be uniformly distributed across the serially connected semiconductor devices, in order to preclude derating the devices, which would add considerably to the cost of the apparatus, and in order to prevent the devices from being damaged by excessive voltages. As hereinbefore mentioned, disposing the devices within a metallic tank containing a fluid insulating and cooling medium, such as oil, and reducing the clearances between the components to those allowed by the insulating medium, increases the distribution constant alpha, which results in a poor distribution of surge potentials across the devices. In order to compensate for the increased capacitance of the assembly to ground, created by the relatively close proximity of the grounded tank to the semiconductor devices, the capacitance of the devices to ground $C_g$ is decreased and the series capacitance of the devices $C_s$ is increased, to reduce the distribution constant alpha to a minimum and achieve a substantially linear distribution of surge potentials across the serially connected semiconductor devices. This is accomplished, as shown in FIGS. 2 and 3, by shielding each tier of devices from ground in a manner which simultaneously reduces the capacitance of the devices to ground and increases the series capacitance of the assembly. More specifically, each tier of devices, such as tiers 64, 66 and 68, are shielded by shielding means, such as electrically conductive shielding members 104, 106 and 108, respectively. The shielding members should be constructed to partially enclose the devices in each layer or tier, by a curved shielding member which is disposed to shield the semiconductor devices from the tank wall 83, and also from the adjacent tiers. In other words, the shielding members, such as shielding member 104 for tier 64, may be formed of a metal strip which is shaped to encircle the outer periphery of the tier, and having its outer edges bent or curved toward the support member 84 to shield the upper and lower sides of the tier, and the ends of the metal strip joined to one another to form a complete electrical shield around the tier. The exact cross sectional configuration of the shielding member 104 is not critical, but sharp corners are to be avoided in order to prevent stress concentrations. Therefore, a cross section which is shaped like a half circle or half of an ellipse would be excellent, shielding the devices of each tier from the tank, shielding adjacent tiers, and providing a smooth rounded surface for reducing voltage gradients.

In order to complete the shielding arrangement of each tier, it is necessary to connect substantially the electrical midpoint of each tier to its associated shielding member, which provides the lowest difference of potential between the semiconductor devices of the tier and its associated shielding member. Assuming that the reverse voltage drop across the tier is equal to E, the electrical midpoint would be that point where the reverse voltage drop would be $E/2$. Since the devices and their associated circuitry are all similar, for practical purposes the electrical and mechanical midpoints would be the same, and if 30 devices are disposed in each tier, the proper connection from the tier to its associated shielding member would be between the 15th and 16th device.

Thus, referring to tier 64, shielding member 104 is electrically connected to the serially connected semiconductor devices by electrical conductor 134, which is substantially the midpoint between where the electrical conductor 114 enters the tier and where electrical conductor 126 leaves the tier. In like manner, in tier 66 shielding member 106 is electrically connected to the serially connected semiconductor devices by electrical conductor 136, and in tier 68 shielding member 108 is electrically connected to the serially connected semiconductor devices by electrical conductor 138.

The shielding members may be in the form of shielding members 104 and 106, as shown in FIG. 3, being a continuous shielding surface disposed about the outer periphery of the tiers, or they may be of any other suitable form in which the devices are shielded from the grounded tank 83 and from the adjacent tiers. For example, another suitable shielding arrangement is shown in FIG. 3 for tier 68, in which each semiconductor device, or each stack of semiconductor devices, may be individually shielded by metallic shielding members 108. Metallic shielding members 108 shield the semiconductor device from the tank 83 and are curved to shield the tier from the adjacent tiers, but instead of continuing uninterrupted from device to device or from stack to stack, each member 108 also has two additional side portions to thus enclose the semiconductor device, or stack of semiconductor devices on all exposed sides, with individual shielding members. Each of the members 108, however, are electrically connected to the adjacent shielding members of the same tier by electrical conductors 140, to form a complete electrical shield about the tier 68, and the electrical midpoint of the serially connected devices of the tier is connected to the shielding arrangement, as hereinbefore described. The exact configuration of the discrete shielding members 108 is not critical, with the important criterion, in addition to shielding the semiconductor devices on all exposed sides, being to avoid sharp corners which would increase voltage gradients.

In order to allow circulation of the cooling and insulating medium within the tank 82, a space 142 should be maintained between the shielding member, such as member 104, and the supporting means 84, which is of sufficient magnitude to allow free flow of the cooling medium around the semiconductor devices and their associated heat sinks. Space 142 would not be necessary if the shielding means is formed of an electrical conductor which has small openings therein, but this arrangement would have the disadvantage of increasing voltage gradients due to the sharp edges of the holes. The capacitance would only be slightly reduced by the holes.

The capictance to ground ($C_g$) of the semiconductor devices is reduced by the shielding means, such as shielding member 104, as the effective capacitance to ground for the devices is reduced to $C_{g2}$ between the devices and the shielding member 104. The fact that the capacitance $C_{g1}$ between the shielding member 104 and the grounded tank 83 may be high, has little bearing on the distribution constant alpha, which is what determines how the surge potentials are distributed across the devices. The semiconductors of each tier are thus shielded from the grounded tank 83, and the capacitance which is used to determine the distribution constant alpha is capacitance $C_{g2}$ between the devices and the tier, and the associated shielding member. Since the devices and the associated shielding member are at substantially the same potential, compared with the potential of the devices to the grounded tank 83, capacitance $C_{g2}$ is a small value which aids substantially in reducing the value of the distribution constant.

The distribution constant alpha is also substantially reduced by increasing the series capacitance $C_s$ of the converter assembly 10. This is accomplished by the extension of the upper and lower edges of the shielding means about the semiconductor devices of each tier, to, in effect, provide capacitor plates between adjacent tiers, as shown in FIG. 2. Since the tiers may be disposed relatively close together compared to their spacing in air, due to the superior insulating qualities of the insulating medium, the shielding members, such as members 104 and 106 formed as disclosed herein, substantially increase the series capacitance $C_s$ between tiers, and therefore aids in uniformly distributing surge potentials across the tiers. Thus, the shielding members for each tier should have their upper and lower edges rounded to provide the greatest possible surface area on the shielding members facing adjacent tiers, without interfering with the free flow of the insulating dielectric around the shielding means and the semiconductor devices.

Thus, in summary there has been disclosed a new and improved electrical converter arrangement which allows a large plurality of serially connected semiconductor devices to be disposed in a metallic tank containing an insulating and cooling medium and still provide a substantially uniform distribution of surge and transient potentials across the devices. Further, the disclosed arrangement dampens voltage oscillations produced by surge potentials which are impressed upon inductive-capacitive circuit arrangements. The structure disclosed has many advantages over air insulated structures, as it allows the size of the electrical converter to be reduced up to 50 to 1, and at the same time disposes the converter within a weatherproof enclosure or tank containing an insulating medium or dielectric which protects and more effectively dissipates the heat produced by the devices, and also eliminates the need for special air conditioned buildings or rooms.

Maintenance of the individual semiconductor devices of the enclosed electrical converter structure disclosed herein may be facilitated by providing means for quickly removing the insulating and cooling fluid from the converter tank to a storage tank, and removing gasketed access panels on the sides of the tanks to gain access to the devices. The shielding members, such as member 104, may be formed in sections which are easily removable to allow quick access to the devices behind the shielding means. Further, if the devices are constructed in stacks, as shown in FIGS. 2 and 3, it is merely necessary to remove and replace a complete stack containing a defective device.

Since numerous changes may be made in the above described apparatus and different embodiments of the invention may be made without departing from the spirit thereof, it is intended that all matter contained in the foregoing description or shown in the accompanying drawings shall be interpreted as illustrative and not in a limiting sense.

We claim as our invention:

1. An electrical converter comprising a plurality of controllable semiconductor devices, said plurality of semiconductor devices being disposed in a plurality of serially connected groups, said plurality of serially connected groups being connected to reverse the direction of current flow in adjacent groups, a tank, insulating and cooling means disposed within said tank, said plurality of groups of semiconductor devices being disposed within said tank, shielding means disposed between each of said groups and said tank to shield the devices of each group from the tank, the shielding means associated with each of said groups being electrically connected to the group, the shielding means of each of said groups also shielding the devices of each of said groups from the devices in the adjacent groups to increase the series capacitance between said groups of semiconductor devices, each of said groups of semiconductor devices being disposed on a common plane, with the planes of the groups being spaced in predetermined parallel relation to one another and perpendicular to a common axis, means for firing the controllable semiconductor devices in the form of a high voltage cable having a plurality of magnetic cores with secondary windings disposed thereon, said magnetic cores being disposed in predetermined spaced relation upon the high voltage cable, each adjacent one of said groups, with the secondary windings being connected to the semiconductor devices of its associated group, and means for providing current pulses to the ends of high voltage cable.

2. The electrical converter of claim 1 wherein said shielding means is connected to substantially the electrical midpoint of its associated group of semiconductor devices.

3. The electrical converter of claim 1 wherein said shielding means is formed of a continuous metallic shield about each group of semiconductor devices having its edges curved to increase the series capacitance between said groups of semiconductor devices.

4. The electrical converter of claim 1 wherein said shielding means for each group includes a plurality of electrically connected discrete shielding members, each of said discrete shielding members being disposed to substantially shield the exposed sides of a predetermined number of semiconductor devices.

5. The electrical converter of claim 1 wherein the semiconductor devices of each group are disposed in a plurality of stacks, wherein each of said stacks has a predetermined number of serially connected devices, and the stacks are serially connected.

6. The electrical converter of claim 1 wherein the shielding means has a plurality of openings therein for allowing said insulating and cooling means to flow therethrough.

References Cited

UNITED STATES PATENTS

| | | | |
|---|---|---|---|
| 2,931,966 | 4/1960 | Rockey | 321—8 |
| 2,984,773 | 5/1961 | Guldemond et al. | 317—234 |
| 3,123,760 | 3/1964 | Wouk et al. | 321—11 |
| 3,173,061 | 3/1965 | Storsand | 317—100 |
| 3,234,451 | 2/1966 | Diebold | 321—8 |
| 3,241,034 | 3/1966 | Ludwig | 321—8 |
| 3,242,412 | 3/1966 | Diebold | 321—11 |
| 3,248,636 | 4/1966 | Colaiaco | 321—8 |

LEE T. HIX, *Primary Examiner.*

G. GOLDBERG, *Assistant Examiner.*